United States Patent
Shibata (10) Patent No.: US 9,566,791 B2
(45) Date of Patent: Feb. 14, 2017

(54) METHOD FOR MANUFACTURING SEMICONDUCTOR CHIP

(71) Applicant: CANON KABUSHIKI KAISHA, Tokyo (JP)

(72) Inventor: Takeshi Shibata, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/040,136

(22) Filed: Feb. 10, 2016

(65) Prior Publication Data
US 2016/0243833 A1  Aug. 25, 2016

(30) Foreign Application Priority Data
Feb. 25, 2015  (JP) .................. 2015-035744

(51) Int. Cl.
*H01L 21/78* (2006.01)
*B41J 2/16* (2006.01)

(52) U.S. Cl.
CPC ............ *B41J 2/1632* (2013.01); *B41J 2/16* (2013.01); *B41J 2/162* (2013.01); *B41J 2/1634* (2013.01); *H01L 21/78* (2013.01)

(58) Field of Classification Search
CPC .............. H01L 21/78; H01L 21/782–21/86; B41J 2/1635
See application file for complete search history.

(56) References Cited

U.S. PATENT DOCUMENTS 8,836,086 B2 * 9/2014 Hiraiwa ............. H01L 33/0095
257/628

FOREIGN PATENT DOCUMENTS

JP    2011-243730 A    12/2011

\* cited by examiner

*Primary Examiner* — Daniel Shook
(74) *Attorney, Agent, or Firm* — Fitzpatrick, Cella, Harper & Scinto (57) ABSTRACT

There is provided a method for manufacturing semiconductor chips in which the chips as many as possible are arranged on one substrate and these chips can be cut with high accuracy in a relatively simple process. For such occasion on a wafer, short sides of the semiconductor chips are laid out to be inclined at an angle of 5° or less to a crystal orientation of the wafer. Thereafter, a laser stealth dicing method is used to form a plurality of first dicing lines along long sides of the individual semiconductor chips and a plurality of second dicing lines along short sides thereof.

9 Claims, 9 Drawing Sheets

METHOD FOR MANUFACTURING SEMICONDUCTOR CHIP

BACKGROUND OF THE INVENTION

Field of the Invention

The present invention relates to a method for manufacturing semiconductor chips.

Description of the Related Art

In wafer dicing for cutting a semiconductor substrate to manufacture a plurality of semiconductor chips, there are proposed various method for avoiding harmful effects following the dicing (cutting). For example, Japanese Patent Laid-Open No. 2011-243730 discloses the structure where for using a C-surface of a sapphire single-crystal substrate as a surface of the substrate, the respective chips are arranged in such a manner that the cutting faces of the substrate at the wafer dicing time intersect with any of surfaces equivalent to an M-surface of the sapphire single-crystal substrate. According to Japanese Patent Laid-Open No. 2011-243730, even in a case of using the sapphire single-crystal substrate, it is possible to suppress the cutting face of each of the chips from being inclined to the substrate surface to avoid the reverse direction current. In addition, Japanese Patent Laid-Open No. 2011-243730 also discloses the structure where each of the chips is formed in a parallelogram shape to enhance a degree of freedom in the intersection angles of the two cutting faces to the M-surface.

SUMMARY OF THE INVENTION

According to a first aspect of the present invention, there is provided a method for manufacturing a plurality of semiconductor chips from a single wafer comprising the steps of: laying out the plurality of semiconductor chips on the wafer; forming a layer of modified regions within the wafer by irradiating the wafer with laser light while moving the wafer, the forming step being a dicing line formation step for forming a plurality of first dicing lines along long sides of the semiconductor chips and a plurality of second dicing lines along short sides of the semiconductor chips that are shorter and more than the first dicing lines; and breaking the wafer along the first dicing lines and the second dicing lines, wherein the second dicing line is inclined at an angle of 5° or less to a crystal orientation of the wafer.

According to a second aspect of the present invention, there is provided a method for manufacturing an inkjet print head for manufacturing a plurality of semiconductor chips for the inkjet print head from a single wafer, comprising the steps of: forming energy generating elements and electrical connection portions corresponding to the plurality of semiconductor chips respectively on the wafer; forming an ejection opening formation member in which ink supply passages corresponding to the plurality of semiconductor chips respectively are formed on the wafer; forming modified regions within the wafer by irradiating the wafer with laser light while moving the wafer, the forming step being a dicing line formation step for forming a plurality of first dicing lines consisting of layers of the modified regions along long sides of the semiconductor chips and a plurality of second dicing lines along short sides of the semiconductor chips that are shorter and more than the first dicing lines; and breaking the wafer along the first dicing lines and the second dicing lines, wherein the second dicing line is inclined at an angle of 5° or less to a crystal orientation of the wafer.

Further features of the present invention will become apparent from the following description of exemplary embodiments (with reference to the attached drawings).

DESCRIPTION OF THE EMBODIMENTS

Incidentally in the conventional method as described in Japanese Patent Laid-Open No. 2011-243730, when each of the chips is formed in either a square shape or parallelogram shape, the chips are generally arranged in a lattice shape to form a matrix horizontally and vertically. Accordingly the cutting lines for separating them are made by a combination of a group of straight lines in parallel to each other and a group of straight lines in parallel to each other that intersect therewith, and therefore the cutting process is relatively simple.

However, in a case of manufacturing more chips from a single substrate, these chips are in most cases arranged to be shifted from each other in rows or in columns. Therefore, the cutting line in at least one direction becomes non-continuous to make the dicing process complicated, thus degrading the productivity or damaging the smoothness of the cutting face in some cases.

The present invention is made in view of the foregoing problems. An object of the present invention is to provide a method for manufacturing semiconductor chips in which while chips as many as possible are arranged on a single substrate, it is possible to cut these chips with high accuracy in a relatively simple process.

Figure 1:
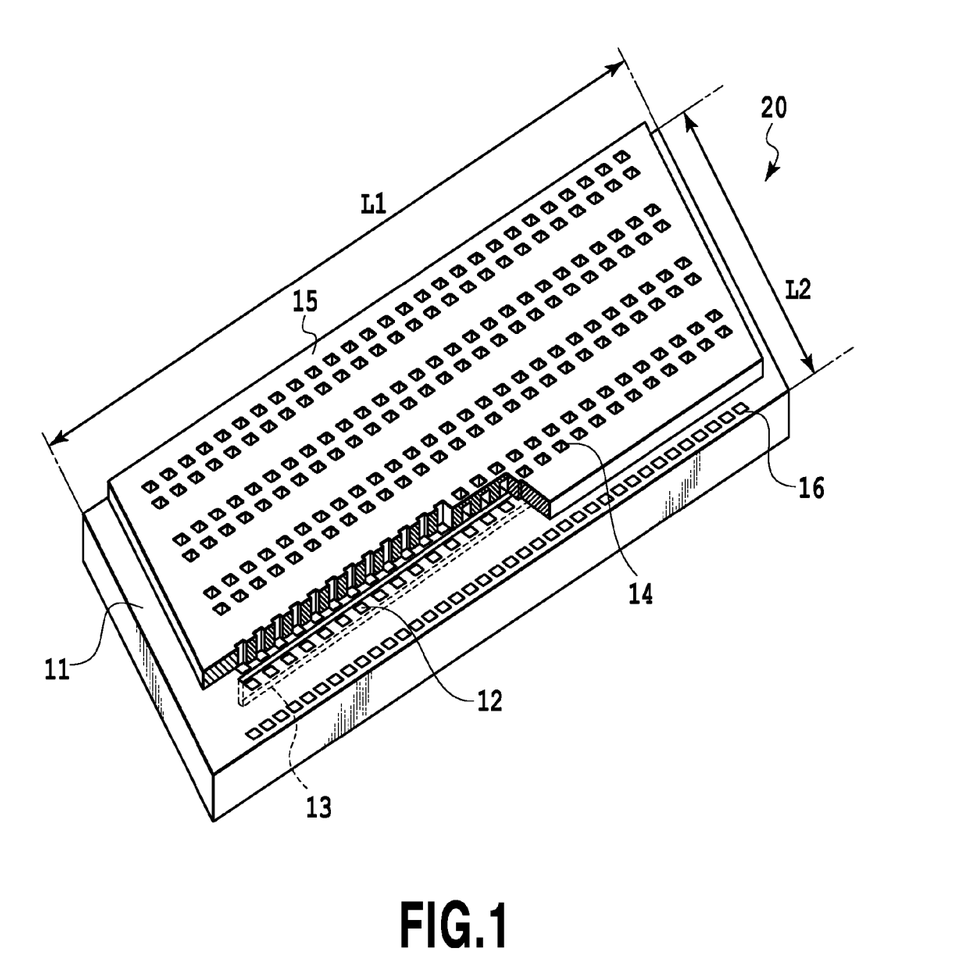
FIG. 1 is a perspective view illustrating a chip for an inkjet print head.

FIG. 1 is a perspective view illustrating a chip 20 for an inkjet print head manufactured according to the present invention. In the chip 20 an ejection opening formation member 15 is formed on a print element substrate 11 (semiconductor chip) made up of a silicon substrate, for example. The print element substrate 11 is provided with a plurality of energy generating elements 12 and electrical connection portions 16 for supply of power to the energy generating elements 12. An example of the energy generating element may include a heat generating resistive element or piezo element. On the other hand, the ejection opening formation member 15 is provided with a plurality of ejection openings 14 and ink supply passages 15 for introducing ink to the ejection openings 14 respectively. The ejection opening formation member 15 is formed on the print element substrate 11 such that the individual energy generating elements 12 correspond to the ejection openings 14 on a one-on-one basis, thus configuring the chip 20 for the inkjet print head. When the voltage is applied to the individual energy generating elements 12 according to image data in this configuration, the energy is given to inks in contact with the energy generating elements 12, thus ejecting the inks as droplets from the ejection openings 14. The print element substrate 11 is formed as a parallelogram shape having long sides L1 and short sides L2.

The energy generating elements 12 and the electrical connection portions 16 are patterned on one sheet of wafer to form the ejection opening formation member 15, which is then diced, thus manufacturing the plurality of chips 20 simultaneously.

Figure 2:
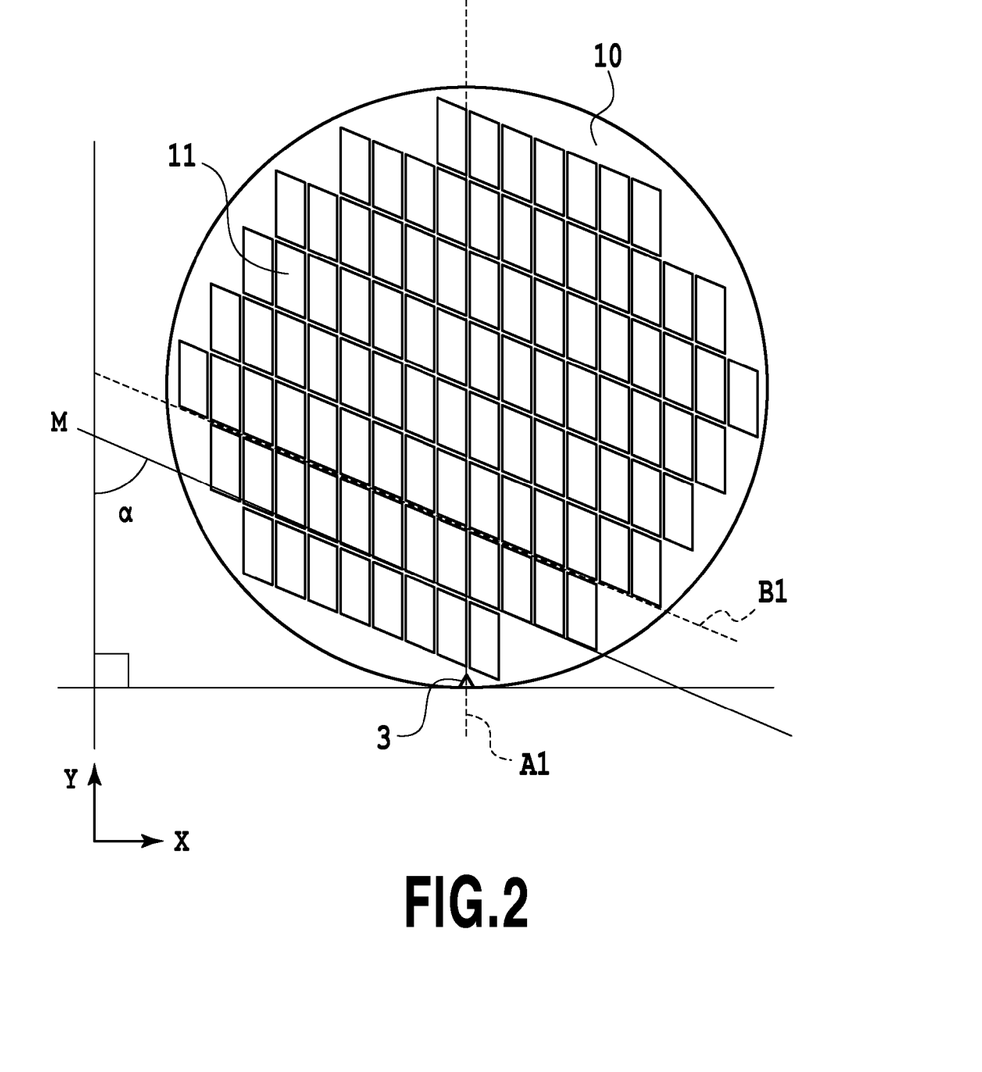
FIG. 2 is a diagram illustrating a general layout example of a plurality of print element substrates in a wafer.

FIG. 2 is a diagram illustrating a general layout example of the plurality of print element substrates 11 on a wafer 10. The parallelogram print element substrates 11 are laid out as illustrated in the figure, each having long sides L1 in parallel to Y axis and short sides L2 in parallel to a straight line M inclined at an angle α of 59° to Y axis on an XY plane on a basis of a notch 3.

In such a layout, the individual print element substrates 11 can be separated in the X direction by dicing (for example, ten times of dicing in FIG. 2) along dicing lines A1 in parallel to Y axis. Further, the individual print element substrates 11 can be separated in the Y direction by dicing (for example, nine times of dicing in FIG. 2) along dicing lines B1 in parallel to the straight line M. Since any of the dicing lines is made up of a straight line, it is possible to adopt a general blade dicing method.

Figure 3:
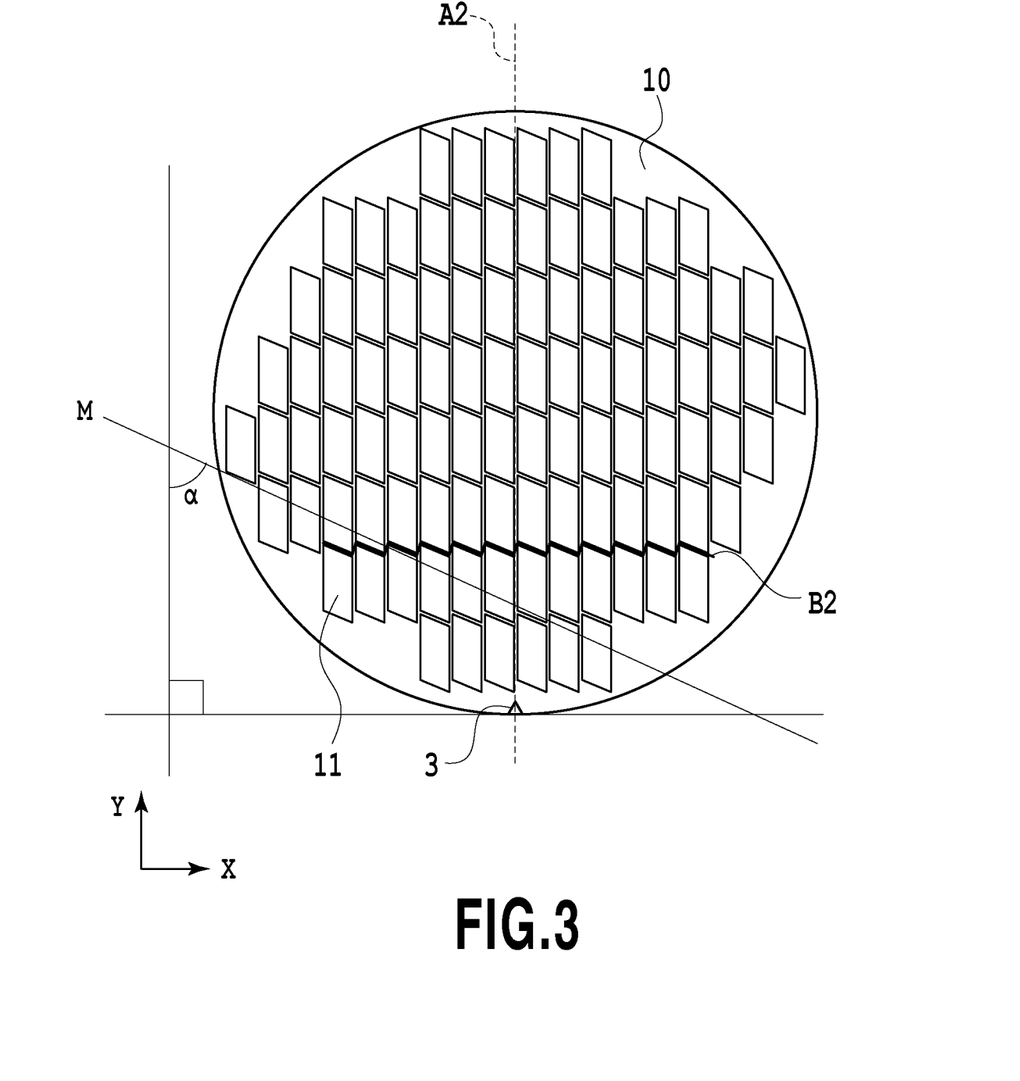
FIG. 3 is a diagram illustrating a layout example in a case of manufacturing the print element substrates as many as possible.

FIG. 3 is a diagram illustrating a layout example of a case of manufacturing print element substrates 11 as many as possible from the single wafer 10 without changing an orientation of each of the print element substrates 11. The orientation of each of the print element substrates 11 is equal to that in FIG. 2, and the long sides L1 are arrayed continuously along Y axis, but the short sides L2 are not arrayed continuously along the straight line M.

In such a layout, the individual print element substrates 11 can be separated in the X direction by dicing (for example, 19 times of dicing in FIG. 3) along first dicing lines A2 in parallel to Y axis. However, second dicing lines B2 for separation in the Y direction each are not continuous in the direction of the straight line M, and are formed as a zigzag route. Therefore in the present invention, not the conventional blade dicing method but a laser stealth dicing method is adopted in the dicing line formation.

The laser stealth dicing method is a method in which laser light is collected in an object lens optics system and a wafer is irradiated with the collected laser light along a predetermined dicing line to form modified regions low in crystal strength in a wafer layer and then the wafer is cut (broken) on the basis of the region. Since the dicing line can be formed in non-contact with the wafer, a degree of freedom in shape and layout of the individual chips (print element substrates 11) can be more enhanced as compared to the blade dicing method.

Figure 4:
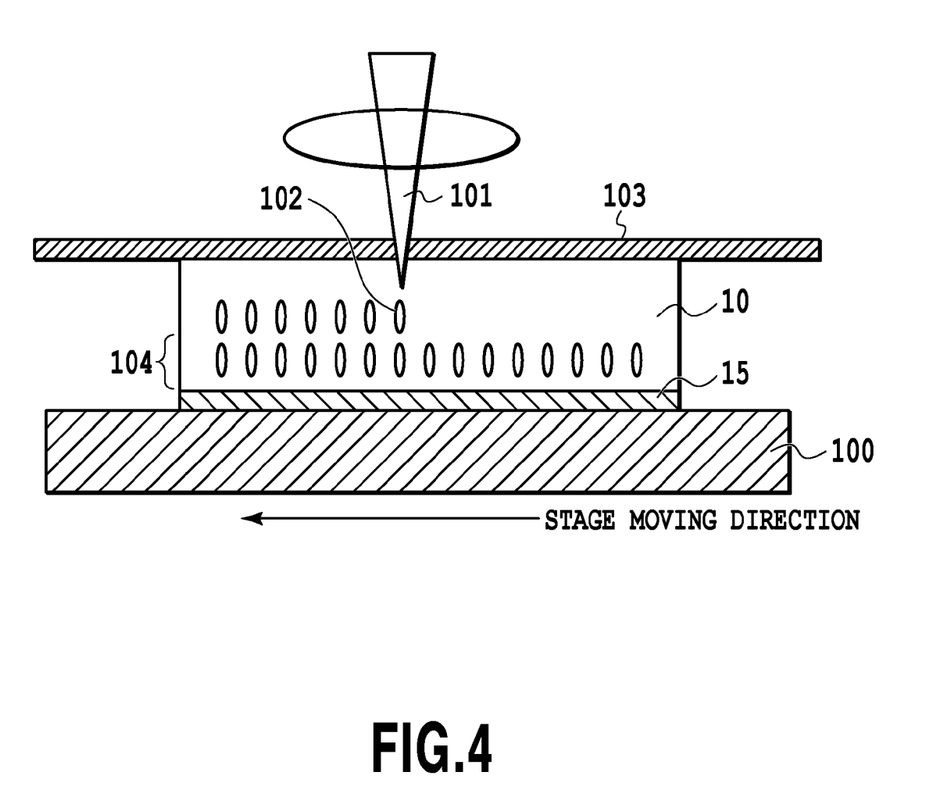
FIG. 4 is a diagram illustrating an irradiation state of laser light in a laser stealth dicing method.

FIG. 4 is a diagram illustrating an irradiation state of the laser light in the laser stealth dicing method. In a state where the ejection opening formation member 15 is directed toward a dicing stage 100, the wafer 10 is mounted on the dicing stage 100, and a dicing tape 103 is attached on the wafer 10 from the backside for fixation. Further, the wafer 10 is irradiated with laser light 101 in such a manner as to be collected within the wafer 10 in predetermined depths, thus forming modified regions 102 in the predetermined depths. On the other hand, the dicing stage 100 is movable on a plane vertical to the irradiation direction of the laser light 101. In addition, by performing an irradiation scan for irradiating the wafer with the laser light 101 in a predetermined cycle while moving the dicing stage 100 in a predetermined speed, it is possible to form a layer 104 of the modified regions where the modified regions 102 are arrayed in the predetermined depth within the wafer.

It should be noted that a plurality of such layers of the modified regions can be formed within the wafer by a plurality of irradiation scans having different focus distances of the laser light 101. In addition, as the number of the layers 104 of the modified regions is made more, the number of times of the irradiation scans becomes the more, but it is possible to improve the efficiency in breaking and certainty in cutting. At this time, the number of the layers 104 of the modified regions can be adjusted appropriately according to various factors in addition to the thickness of the wafer 10 or the intensity of the laser light 101. Here, the thickness of the wafer 10 is set to 0.625 mm, and FIG. 4 illustrates a state of performing the irradiation scan for the modified regions 102 in the second layer. The dicing line is formed by the layer of these modified regions. That is, the layer of the modified regions becomes the dicing line.

Figure 5A:
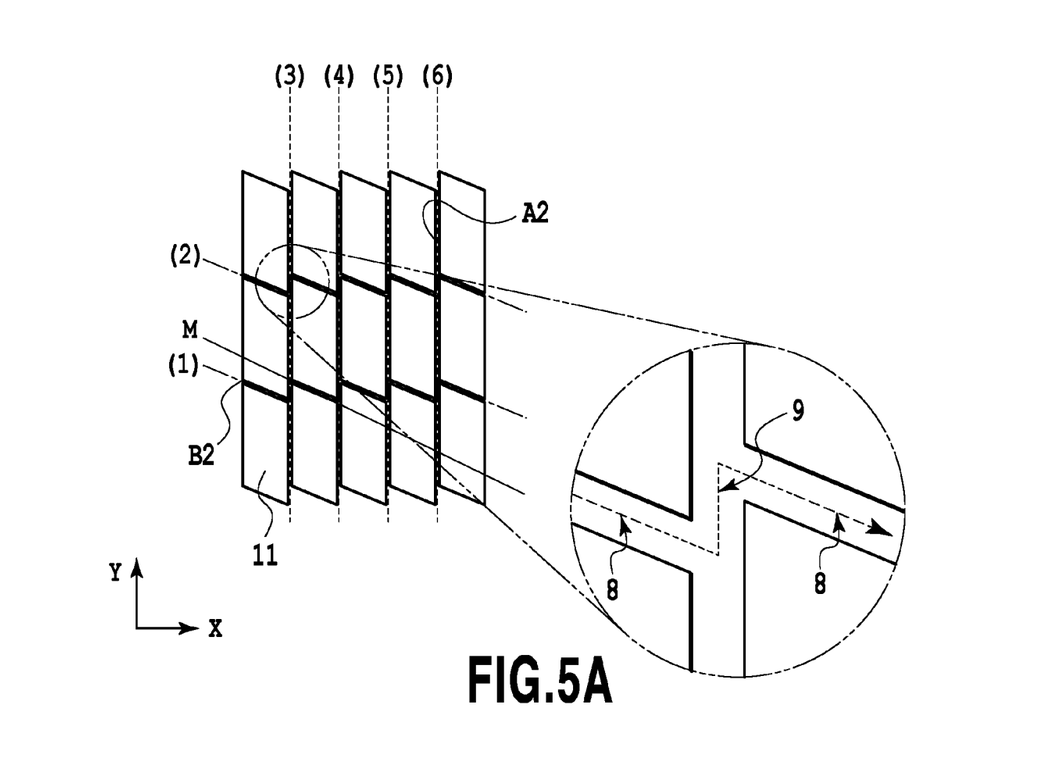
FIGS. 5A and 5B are enlarged views illustrating dicing lines.
Figure 5B:
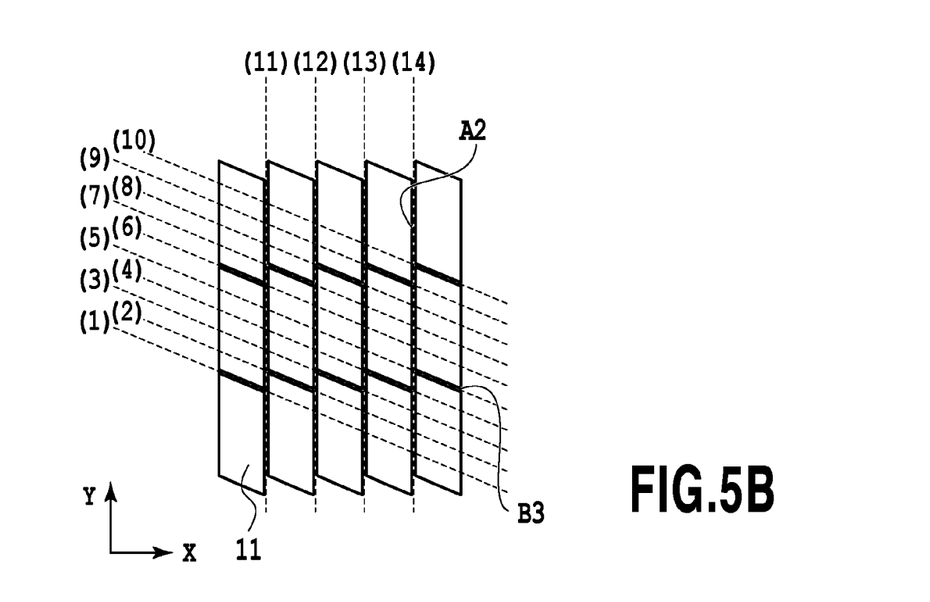

FIGS. 5A and 5B are diagrams each illustrating dicing lines B2, that is, the irradiation routes of the laser light 101 for separation in the Y direction of the print element substrates 11 laid out as in FIG. 3. The dicing line B2 is not continuous along the straight line M, but is a zigzag route. Therefore the irradiation route of the laser light 101 also has first sections 8 in parallel to the straight line M and second sections 9 in parallel to a first dicing line A2 that are alternately arranged. At this time, when the irradiation of the laser light 101 is performed along the second zigzag dicing line B2, the moving speed of the dicing stage 100 varies between the first section 8 and the second section 9. Further, there are some cases where array pitches of the modified regions 102 do not become constant and the cutting faces after cutting the wafer 101 become non-uniform.

Therefore the first section 8 and the second section 9 are irradiated with the laser light 101 by different irradiation scans. Specifically as illustrated in FIG. 5B, the irradiation scan of the laser light 101 is made to differ for each position along the short sides of the individual print element substrates 11. That is, in a case of FIG. 5B, ten times of the irradiation scans along the short sides L2 (second dicing line B3) are necessary for cutting the individual print element substrates 11 to each other in the Y direction. On the other hand, in regard to separation of the long sides, as similar to the case of FIG. 5A, the irradiation scan is performed along the first dicing line A2. By doing this, in both of the cutting between the short sides L2 and the cutting between the long sides L1, the speed of the irradiation scan on the wafer 10 can be held constant to array the modified regions 102 in a constant pitch.

Figure 6:
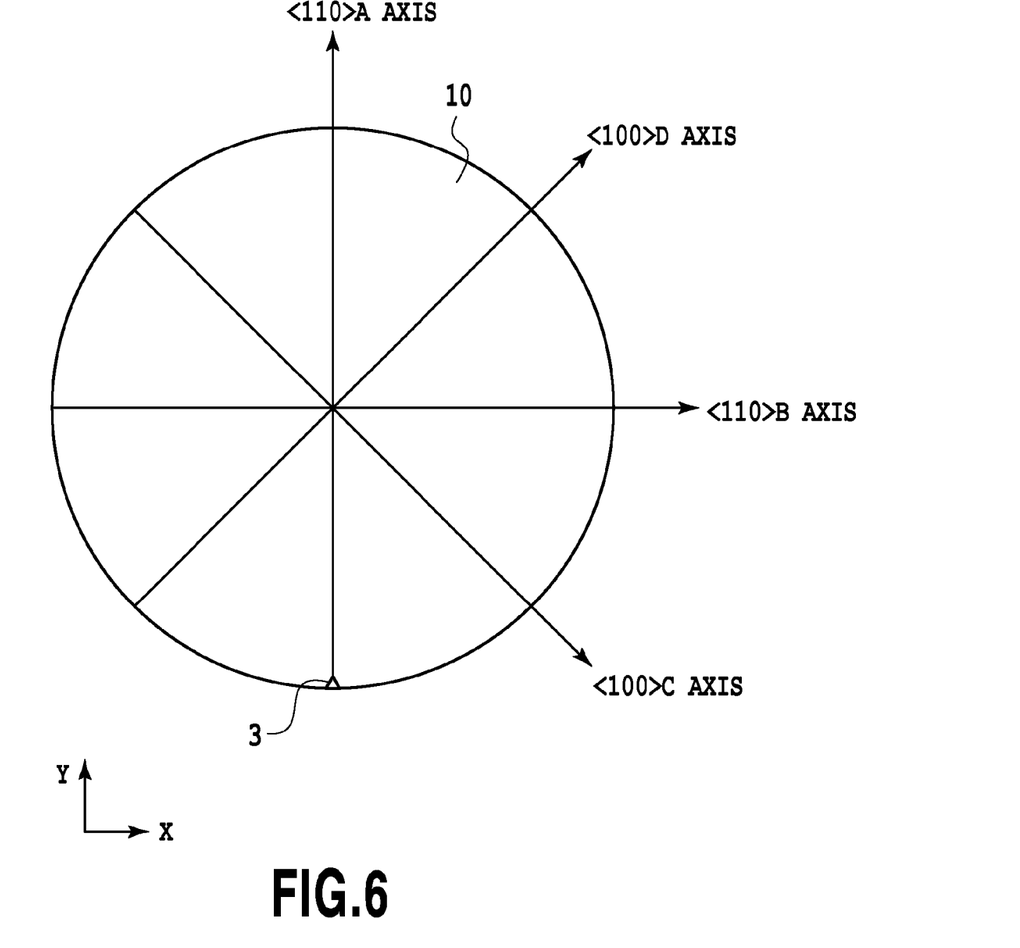
FIG. 6 is a diagram illustrating crystal orientations of a wafer.

On the other hand, the state of the cutting face depends also on the crystal orientation of the wafer 10. FIG. 6 is a diagram illustrating the crystal orientations of the wafer 10. The wafer 10 has A axis of the crystal orientation <110>, B axis vertical to A axis, and C axis and D axis of the crystal orientation <100> respectively meeting A axis and B axis at angles of ±45°. The notch 3 is formed in the wafer 10 such that A axis of the crystal orientation <110> is in parallel to Y axis.

Figure 7A:
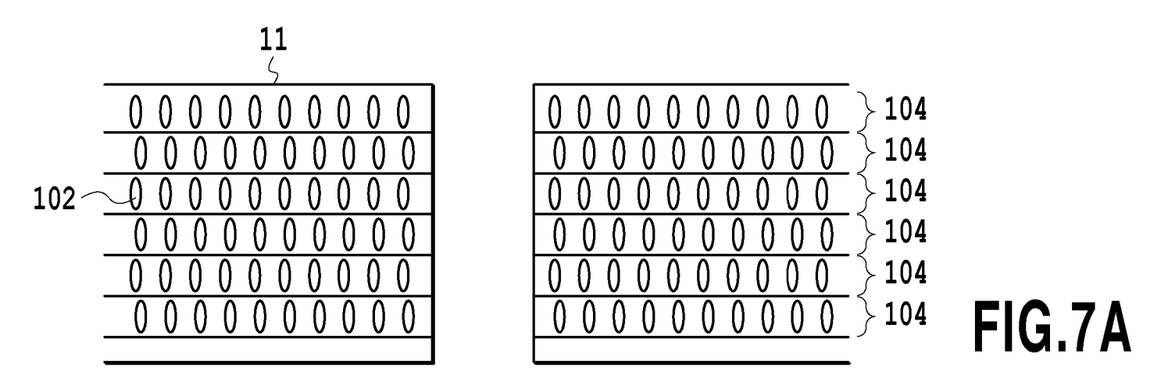
FIGS. 7A and 7B are diagrams each illustrating a cutting state depending on the crystal orientation.
Figure 7B:
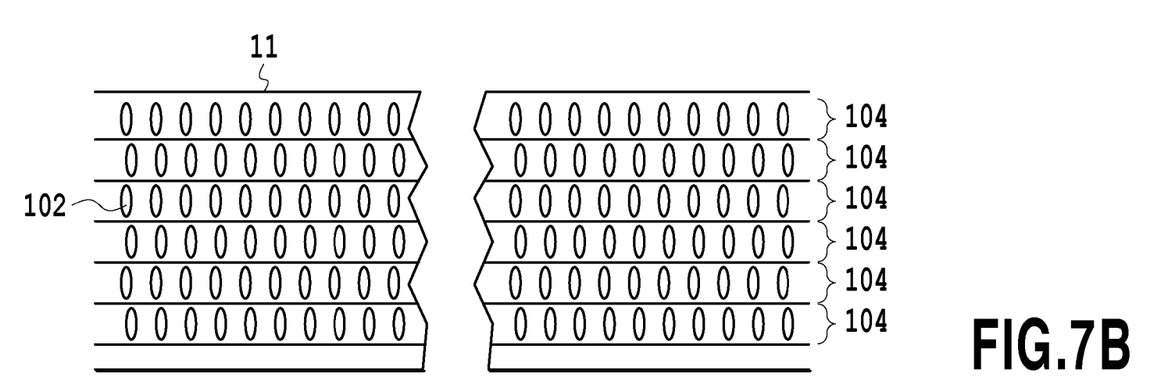

FIGS. 7A and 7B are diagrams for comparing the respective states between a case where the cutting direction conforms to the crystal orientation and a case where it does not conform thereto. The irradiation scans explained in FIG.

4 are performed, and the plurality of layers 104 of the modified regions are laminated within the wafer 10 in the depth direction. Here, there is illustrated a case where the lamination number is six.

In a case where the cutting face conforms to the crystal orientation, the modified region 102 is inclined to easily extend in the thickness direction of the wafer 10 and the resistance at the cutting is small. Therefore a smooth cutting face can be obtained as illustrated in FIG. 7A. In other words, so many layers 104 of the modified regions are not required for obtaining a preferable cutting face. On the other hand, in a case where the cutting direction is shifted from the crystal orientation, the resistance at the cutting is large, and uneven cutting faces are inclined to be easily formed between the layers of the modified regions as illustrated in FIG. 7B. In other words, many layers 104 of the modified regions are required to be provided to some extent for obtaining the preferable cutting face.

Figure 8A:
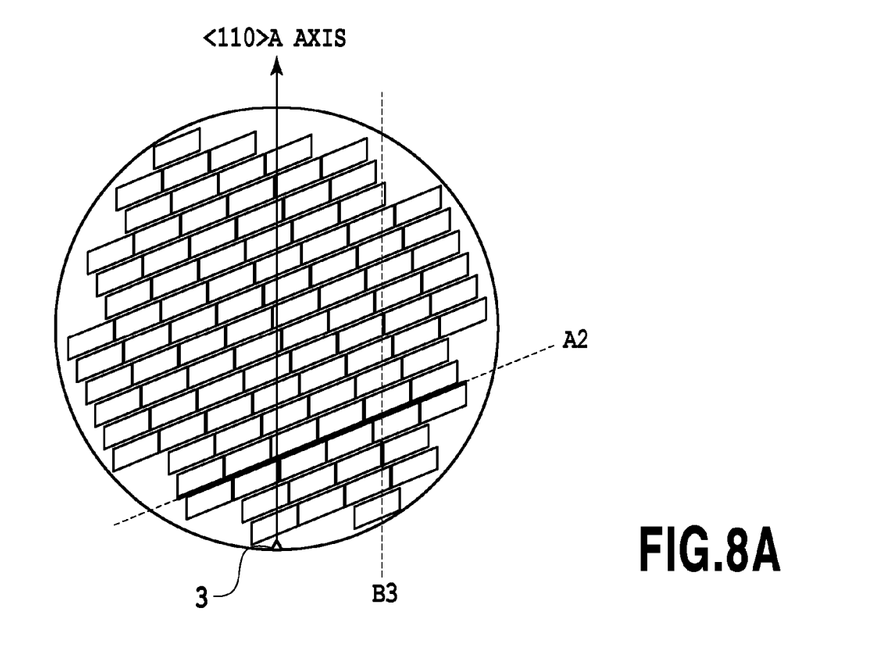
FIGS. 8A and 8B are diagrams each illustrating a layout of a crystal orientation and print element substrates.
Figure 8B:
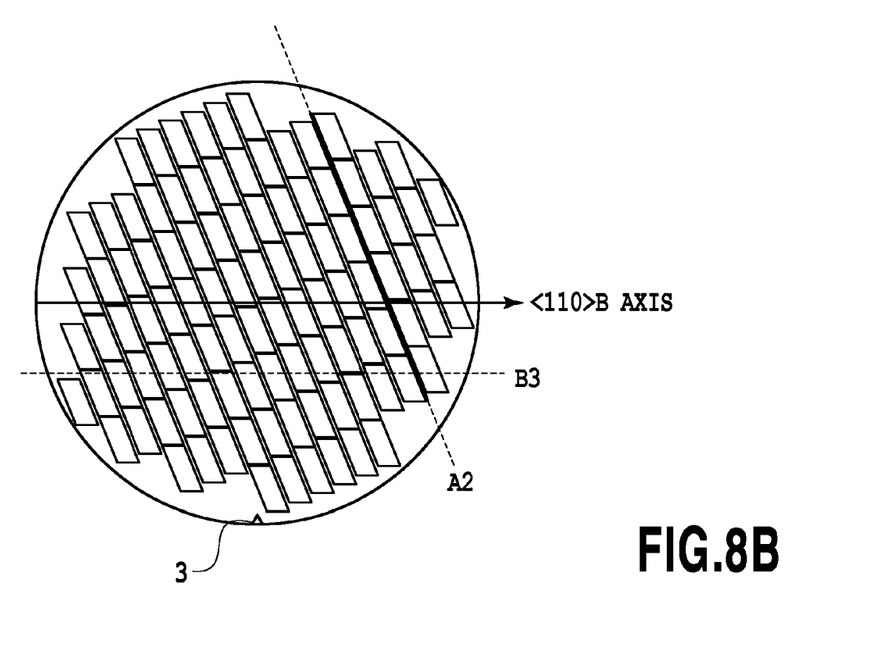

FIGS. 8A and 8B are diagrams each illustrating a layout state of the print element substrates 11 relative to the crystal orientation of the wafer 10. FIG. 8A illustrates a layout in which A axis of the crystal orientation <110> is in parallel to the short side L2 of the print element substrate 11, and FIG. 8B illustrates a layout in which B axis of the crystal orientation <110> is in parallel to the short side L2 of the print element substrate 11. In any case, the short side L2, that is, a second dicing line B3 is made to conform to the crystal orientation. In this way, the present invention is characterized in that the direction of the second dicing line B3 having need of many irradiation scans each having the short distance is made to conform to the crystal orientation as much as possible. That is, the second dicing line B3 is aligned by the crystal orientation A (or B) axis. Specifically the second dicing line B3 is inclined at an angle of 5° or less to the crystal orientation of the wafer, more preferably at an angle of 2° or less.

On the other hand, in regard to the first dicing line A2 having need of a small number of times of the irradiation scans each having a long distance, the layers 104 of the modified regions explained in FIG. 4 are formed more than those of the second dicing line B3. In a case of performing a small number of times of the irradiation scans each having the long distance, even if the number of the layers 104 of the modified regions increases, it is possible to suppress the tact loss to be smaller as compared to a case of performing many times of the irradiation scans each having the short distance. In this way, in regard to the second dicing line B3 possibly causing more task losses, a smoother cutting face can be realized by aligning the direction to the crystal orientation. At the same time, in regard to the first dicing line A2 having no possibility of causing so many task losses, a smoother cutting face can be realized by forming more layers 104 of the modified regions. In a case where a semiconductor chip is formed in a parallelogram shape, the long side of the semiconductor chip is preferably inclined at an angle of more than 5° to the crystal orientation of the wafer.

In the layout in FIG. 8A or FIG. 8B the print element substrates 11 are formed, and the first dicing line A2 and the second dicing line B3 are formed by a plurality of times of the irradiation scans. Thereafter, the wafer 10 is broken along the first dicing line A2 and the second dicing line B3. It is possible to manufacture the print element substrates 11 each having the smooth cutting faces on both of the long side L1 and the short side L2 simultaneously.

Figure 9A:
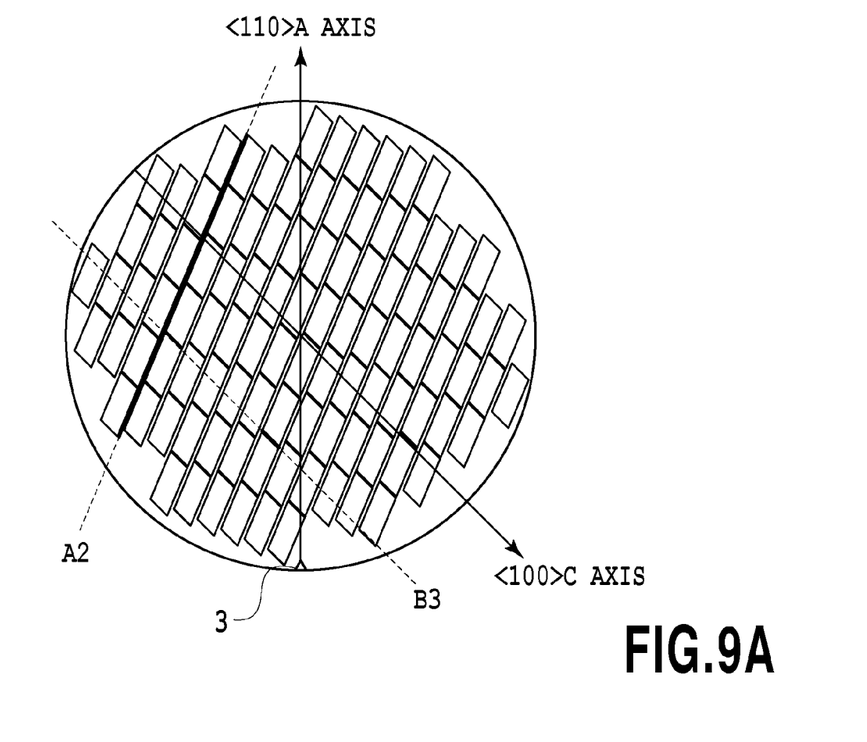
FIGS. 9A and 9B are diagrams each illustrating a layout of a crystal orientation and print element substrates.
Figure 9B:
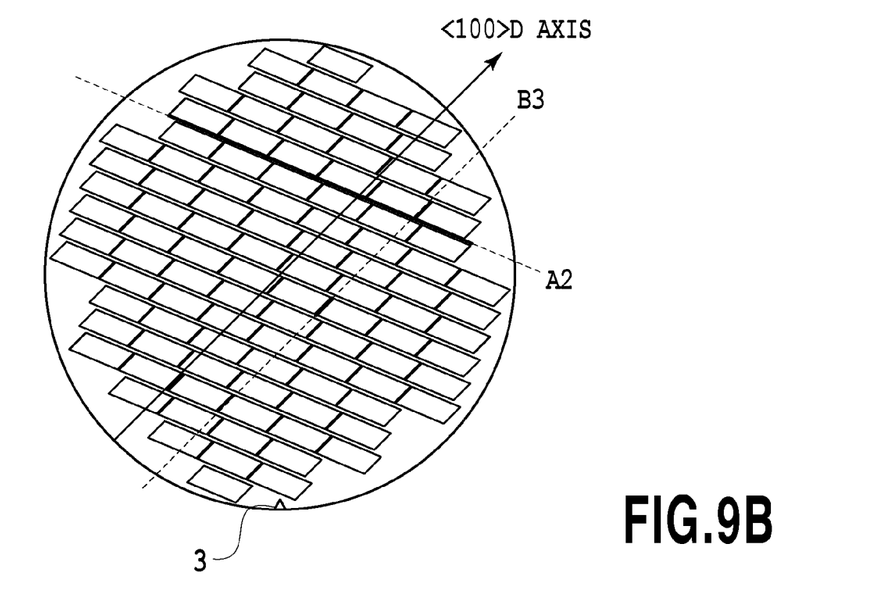

It should be noted that in FIGS. 8A and 8B, the print element substrates 11 are laid out such that the plurality of second dicing lines B3 are in parallel to A axis of the crystal orientation <110> and B axis vertical thereto. However, the present invention is not limited thereto. As explained in FIG. 6, when the wafer 10 further includes C axis and D axis of a different crystal orientation <100>, as illustrated in FIGS. 9A and 9B, the print element substrates 11 may be laid out such that the second dicing line B3 is in parallel to C axis and D axis. Even in the layouts as illustrated in FIGS. 9A and 9B, the effect as similar to that in the layouts as illustrated in FIGS. 8A and 8B can be obtained by adopting the method for manufacturing the semiconductor chips as described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-035744 filed Feb. 25, 2015, which is hereby incorporated by reference wherein in its entirety.

What is claimed is:

1. A method for manufacturing a plurality of semiconductor chips from a single wafer comprising the steps of:
   laying out the plurality of semiconductor chips on the wafer;
   forming a layer of modified regions within the wafer by irradiating the wafer with laser light while moving the wafer, the forming step being a dicing line formation step for forming a plurality of first dicing lines along long sides of the semiconductor chips and a plurality of second dicing lines along short sides of the semiconductor chips that are shorter and more than the first dicing lines; and
   breaking the wafer along the first dicing lines and the second dicing lines, wherein
   the second dicing line is inclined at an angle of 5° or less to a crystal orientation of the wafer.

2. The method for manufacturing the semiconductor chips according to claim 1, wherein
   the second dicing line is inclined at an angle of 2° or less to the crystal orientation of the wafer.

3. The method for manufacturing the semiconductor chips according to claim 1, wherein
   the semiconductor is formed in a parallelogram shape and the long side is inclined at an angle of more than 5° to the crystal orientation of the wafer.

4. The method for manufacturing the semiconductor chips according to claim 1, wherein
   in the step for forming the dicing line, the layer of the modified regions comprises a plurality of layers laminated within the wafer, and the lamination number of the modified regions in the first dicing line is more than the lamination number of the modified regions in the second dicing line.

5. The method for manufacturing the semiconductor chips according to claim 1, wherein
   the crystal orientation is a crystal orientation of <110>.

6. The method for manufacturing the semiconductor chips according to claim 1, wherein
   the crystal orientation is a crystal orientation of <100>.

7. The method for manufacturing the semiconductor chips according to claim 1, wherein
   the semiconductor chip is a chip for an inkjet print head in which energy generating elements for ejecting ink and supply passages for introducing the ink to the energy generating elements are formed.

8. A method for manufacturing an inkjet print head for manufacturing a plurality of semiconductor chips for the inkjet print head from a single wafer, comprising the steps of:
- forming energy generating elements and electrical connection portions corresponding to the plurality of semiconductor chips respectively on the wafer;
- forming an ejection opening formation member in which ink supply passages corresponding to the plurality of semiconductor chips respectively are formed on the wafer;
- forming modified regions within the wafer by irradiating the wafer with laser light while moving the wafer, the forming step being a dicing line formation step for forming a plurality of first dicing lines consisting of layers of the modified regions along long sides of the semiconductor chips and a plurality of second dicing lines along short sides of the semiconductor chips that are shorter and more than the first dicing lines; and
- breaking the wafer along the first dicing lines and the second dicing lines, wherein
- the second dicing line is inclined at an angle of 5° or less to a crystal orientation of the wafer.

9. The method for manufacturing the inkjet print head according to claim 8, wherein
- the second dicing line is inclined at an angle of 2° or less to the crystal orientation of the wafer.

* * * * *